US010076054B2

(12) United States Patent
Goergen et al.

(10) Patent No.: US 10,076,054 B2
(45) Date of Patent: Sep. 11, 2018

(54) ADJUSTABLE CABLE MANAGEMENT FOR FIBER AND CABLE

(71) Applicant: Cisco Technology, Inc., San Jose, CA (US)

(72) Inventors: Joel R. Goergen, Soulsbyville, CA (US); Rohit Dev Gupta, Bangalore (IN); Arjun Jayaprakash, Bangalore (IN); Robert Curto, Port Charlotte, FL (US); Charles Calvin Byers, Wheaton, IL (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 15/243,178

(22) Filed: Aug. 22, 2016

(65) Prior Publication Data

US 2017/0290192 A1    Oct. 5, 2017

(30) Foreign Application Priority Data

Mar. 31, 2016 (IN) .............................. 201621011267

(51) Int. Cl.
*H05K 7/14* (2006.01)
*G02B 6/44* (2006.01)
(Continued)

(52) U.S. Cl.
CPC .......... *H05K 7/1491* (2013.01); *G02B 6/444* (2013.01); *G02B 6/4452* (2013.01); *G02B 6/4453* (2013.01); *G02B 6/4471* (2013.01); *G02B 6/4478* (2013.01); *F16B 2001/0035* (2013.01); *G02B 6/4457* (2013.01); *H02G 3/0456* (2013.01); *H02G 3/30* (2013.01)

(58) Field of Classification Search
CPC .. G02B 6/4452; G02B 6/4459; G02B 6/4478; G02B 6/4457; G02B 6/4471; H04Q 1/062; H04Q 1/064; H04Q 1/021; H04Q 2201/02; H02G 3/0456; H02G 3/32; H02G 3/0406; H02G 3/30; H05K 7/1491; H05K 7/1497
USPC ..... 248/49, 68.1, 121, 220.31; 385/134–137, 385/147; 211/26
See application file for complete search history.

(56) References Cited

U.S. PATENT DOCUMENTS

| | | | | |
|---|---|---|---|---|
| 4,017,137 A | * | 4/1977 | Parks | H01R 25/164 174/481 |
| 4,136,257 A | * | 1/1979 | Taylor | H02G 3/045 174/68.3 |

(Continued)

OTHER PUBLICATIONS

"ADC Fiber Management Tray-D (FMT-D) User Manual", ADCP-90-451, Issue 1, Jan. 2010, 20 pages, ADC Telecommunications, Inc.

*Primary Examiner* — Stanton L Krycinski
*Assistant Examiner* — Taylor L Morris
(74) *Attorney, Agent, or Firm* — Parker Ibrahm & Berg LLP; James M. Behmke; Stephen D. LeBarron

(57) ABSTRACT

In one embodiment, an adjustable cable management system is disclosed. The system includes a tray base having a first end. The system also includes a tray door coupled to the tray base and substantially opposite the first end of the tray base when in a closed position. The system further includes a plurality of cable guides coupled to the first end of the tray base and located between the first end of the tray base and the tray door. A particular cable guide is coupled to the first end of the tray base at a selected angle from among a plurality of selectable angles.

11 Claims, 12 Drawing Sheets

(51) Int. Cl.
*H02G 3/30* (2006.01)
*H02G 3/04* (2006.01)
*F16B 1/00* (2006.01)

(56) References Cited

U.S. PATENT DOCUMENTS

| | | | |
|---|---|---|---|
| 4,792,203 A | 12/1988 | Nelson et al. | |
| 5,093,887 A | 3/1992 | Witte | |
| 5,100,221 A * | 3/1992 | Carney | G02B 6/4452 385/135 |
| 5,401,193 A * | 3/1995 | Lo Cicero | H01R 13/518 361/823 |
| 5,442,726 A * | 8/1995 | Howard | H04Q 1/021 385/134 |
| 5,645,155 A * | 7/1997 | Houghton | B65G 39/12 193/35 R |
| 6,109,561 A * | 8/2000 | Haines | H02G 1/08 242/598.3 |
| 6,263,141 B1 * | 7/2001 | Smith | G02B 6/4455 385/135 |
| 6,310,294 B1 * | 10/2001 | Di Girolamo | H02G 3/0456 174/101 |
| 6,311,007 B1 | 10/2001 | Daoud | |
| 6,353,696 B1 * | 3/2002 | Gordon | G02B 6/4452 385/135 |
| 6,388,193 B2 * | 5/2002 | Maynard | G02B 6/4459 174/135 |
| 6,398,149 B1 * | 6/2002 | Hines | A47B 21/06 242/388.6 |
| 6,547,192 B2 * | 4/2003 | Rinderer | H02G 3/0608 248/49 |
| 6,600,107 B1 * | 7/2003 | Wright | H02B 1/202 174/101 |
| 6,766,093 B2 * | 7/2004 | McGrath | H04Q 1/066 379/327 |
| 6,771,872 B2 * | 8/2004 | Wu | G02B 6/4471 385/136 |
| 6,857,628 B2 * | 2/2005 | Baker | A47B 87/0207 269/45 |
| 6,935,598 B2 * | 8/2005 | Sono | H02G 3/26 248/71 |
| 7,097,473 B2 * | 8/2006 | Krampotich | G02B 6/4471 439/134 |
| 7,207,436 B1 * | 4/2007 | Houghton | B65G 15/60 198/831 |
| 7,298,951 B2 * | 11/2007 | Smrha | G02B 6/4452 385/135 |
| 7,302,153 B2 * | 11/2007 | Thom | G02B 6/4452 385/134 |
| 7,417,188 B2 * | 8/2008 | McNutt | H02G 3/045 174/101 |
| 7,431,610 B2 * | 10/2008 | Laursen | H04Q 1/064 211/26 |
| 7,437,048 B2 * | 10/2008 | Farrell | G02B 6/4452 385/134 |
| 7,540,806 B2 * | 6/2009 | Tastad | A63F 13/08 16/324 |
| 7,600,720 B2 * | 10/2009 | Vogel | H05K 7/1491 248/49 |
| 7,702,207 B2 * | 4/2010 | Adomeit | G02B 6/4452 385/134 |
| 7,751,673 B2 * | 7/2010 | Anderson | G02B 6/4455 385/135 |
| 7,756,379 B2 * | 7/2010 | Kowalczyk | G02B 6/4441 385/135 |
| 7,773,850 B2 * | 8/2010 | Caveney | G02B 6/4452 385/134 |
| 7,840,111 B2 * | 11/2010 | Elisson | G02B 6/4452 385/135 |
| 8,488,936 B2 * | 7/2013 | Sayres | G02B 6/4459 174/481 |
| 8,512,067 B2 * | 8/2013 | Denter | H01R 4/2429 439/403 |
| 8,879,881 B2 * | 11/2014 | Cote | G02B 6/4471 174/50 |
| 8,886,003 B2 * | 11/2014 | Nieves | G02B 6/4446 385/134 |
| 2003/0223723 A1 * | 12/2003 | Massey | G02B 6/4452 385/135 |
| 2004/0011547 A1 * | 1/2004 | Wright | H04Q 1/09 174/50 |
| 2005/0247650 A1 * | 11/2005 | Vogel | H04Q 1/068 211/26 |
| 2008/0050084 A1 * | 2/2008 | Sjodin | G02B 6/4471 385/135 |
| 2008/0050085 A1 * | 2/2008 | Tinucci | G02B 6/4471 385/135 |
| 2009/0224110 A1 * | 9/2009 | Donowho | H02G 3/0456 248/65 |
| 2010/0150518 A1 * | 6/2010 | Leon | G02B 6/4452 385/135 |
| 2011/0150408 A1 * | 6/2011 | Fewster | G02B 6/4459 385/135 |
| 2011/0268413 A1 * | 11/2011 | Cote | G02B 6/4471 385/135 |
| 2013/0077927 A1 * | 3/2013 | O'Connor | G02B 6/4452 385/135 |
| 2013/0134115 A1 * | 5/2013 | Hernandez-Ariguznaga | H05K 7/16 211/26 |
| 2014/0010510 A1 * | 1/2014 | Blackard | G02B 6/4453 385/135 |
| 2014/0076830 A1 * | 3/2014 | Westby | F16M 11/18 211/26 |
| 2015/0366100 A1 * | 12/2015 | Larsen | F16L 3/23 248/69 |

\* cited by examiner

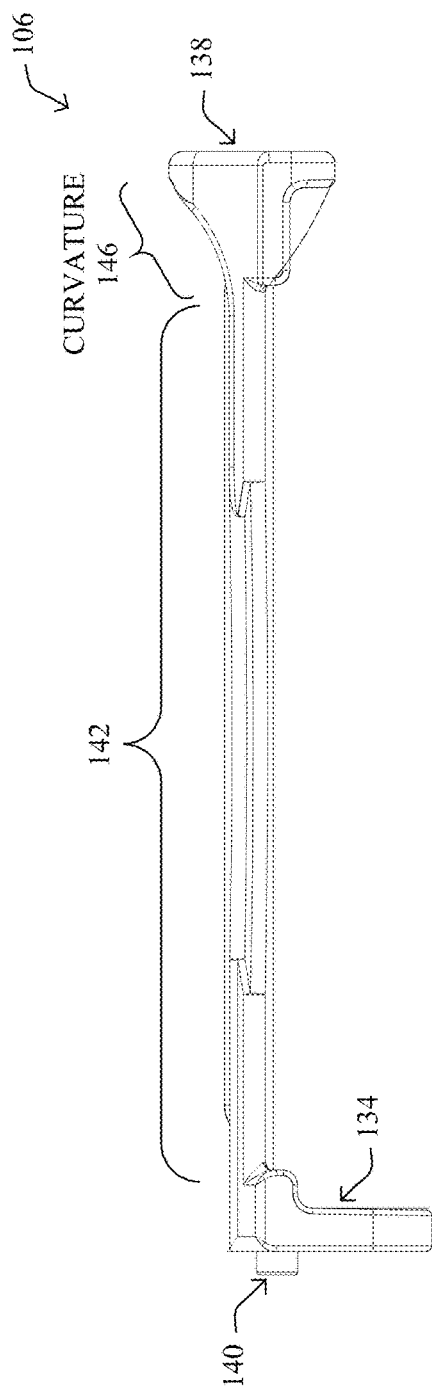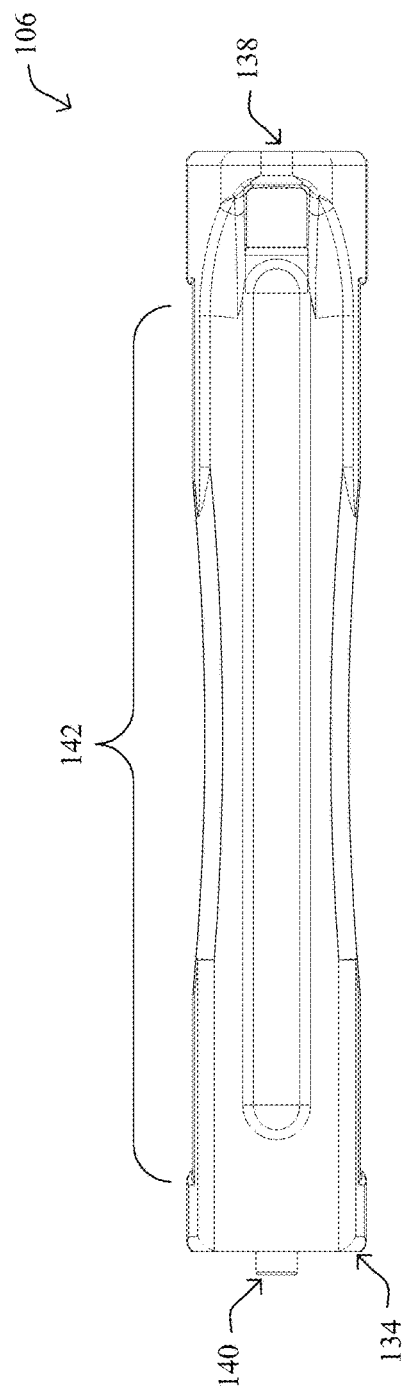
FIG. 4B
FIG. 4C

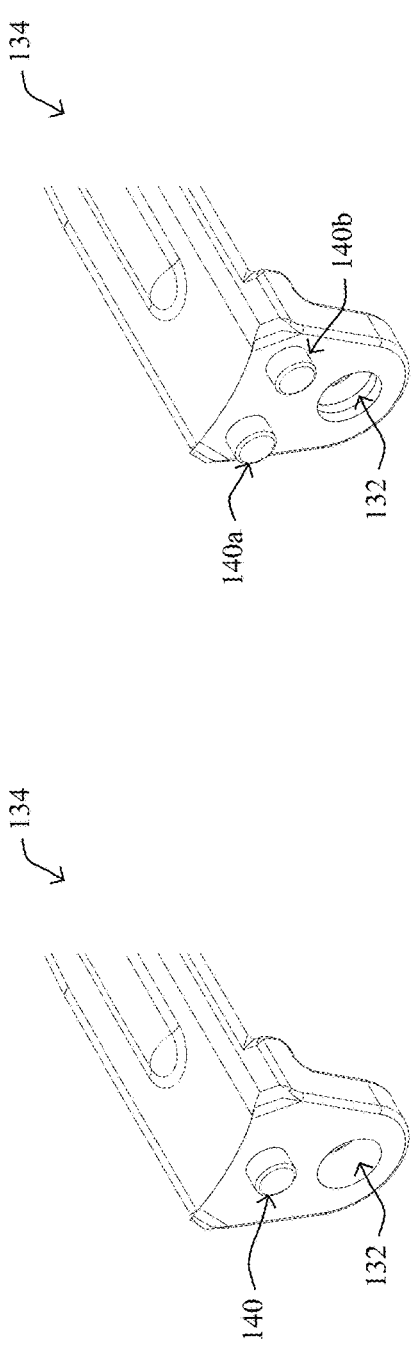
FIG. 5A
FIG. 5B
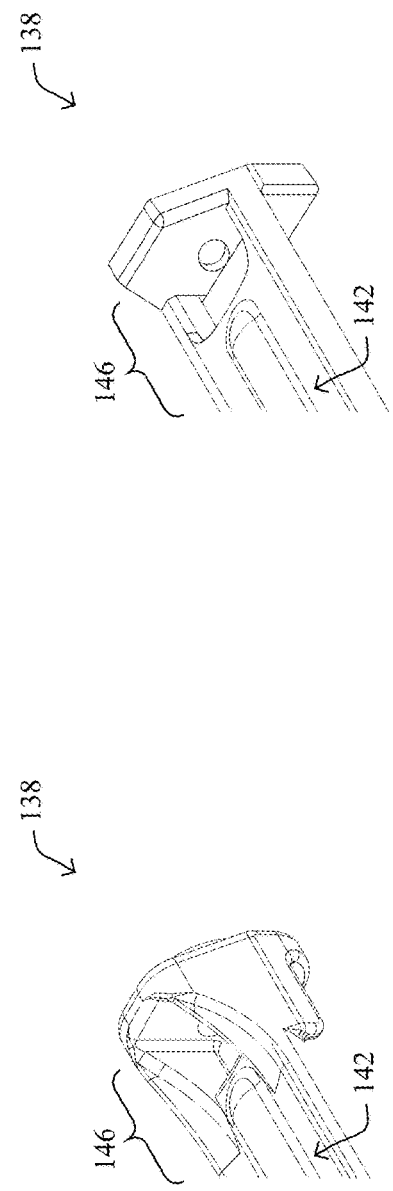
FIG. 6A
FIG. 6B

ADJUSTABLE CABLE MANAGEMENT FOR FIBER AND CABLE

RELATED APPLICATIONS

This application claims foreign priority to Indian Provisional Application No. 201621011267, filed Mar. 31, 2016, entitled "ADJUSTABLE CABLE MANAGEMENT FOR FIBER AND CABLE," by Goergen et al., the contents of which are hereby incorporated by reference.

TECHNICAL FIELD

The present disclosure relates generally to computing devices and, more particularly, to an adjustable cable management system for a computing device.

BACKGROUND

Many computing and other networking devices use a card-based configuration in which a chassis/housing can hold a plurality of removable card modules. For example, the housing of a particular carrier router may include 24 slots for fabric cards. These cards may be wired using, e.g., optical array cables (e.g., fabric cables), electric cables, or the like. Depending on the configuration of the system and the number of cards, this can lead to the cabling taking up significant space and making cable management challenging.

BRIEF DESCRIPTION OF THE DRAWINGS

The embodiments herein may be better understood by referring to the following description in conjunction with the accompanying drawings in which like reference numerals indicate identically or functionally similar elements, of which:

FIGS. 4A-4C illustrate an example cable guide;

FIGS. 5A-5B illustrate example retention ends of a cable guide;

FIGS. 6A-6B illustrate example door engagement ends of a cable guide;

DESCRIPTION OF EXAMPLE EMBODIMENTS

Overview

According to one or more embodiments of the disclosure, an adjustable cable management system is disclosed. The system includes a tray base having a first end. The system also includes a tray door coupled to the tray base and substantially opposite the first end of the tray base when in a closed position. The system further includes a plurality of cable guides coupled to the first end of the tray base and located between the first end of the tray base and the tray door. A particular cable guide is coupled to the first end of the tray base at a selected angle from among a plurality of selectable angles.

Description

Various computing and networking devices use a card-based configuration in which a multi-slot chassis houses a plurality of cards. The cards may be interconnected via cabling (e.g., optical, electrical, etc.) within the chassis, allowing the cards to communicate with one another and/or other computing devices. For example, in a multi-shelf system, an ingress line card may be wired to an egress line card via a fabric plane.

According to the techniques herein, a configurable cable management system is introduced that allows a user/technician to configure the direction of egress on an individual cable basis. Notably, and in contrast to systems that statically route the cables towards an particular egress, the cable management system herein allows the user to easily configure the system to route the cables as desired on an individual basis. In further aspects, the techniques herein allow for the tray door of the system to remain flush with the device housing, advantageously allowing the user to place notes or labels on the system (e.g., to indicate where each cable is routed, etc.).

Figure 1A:
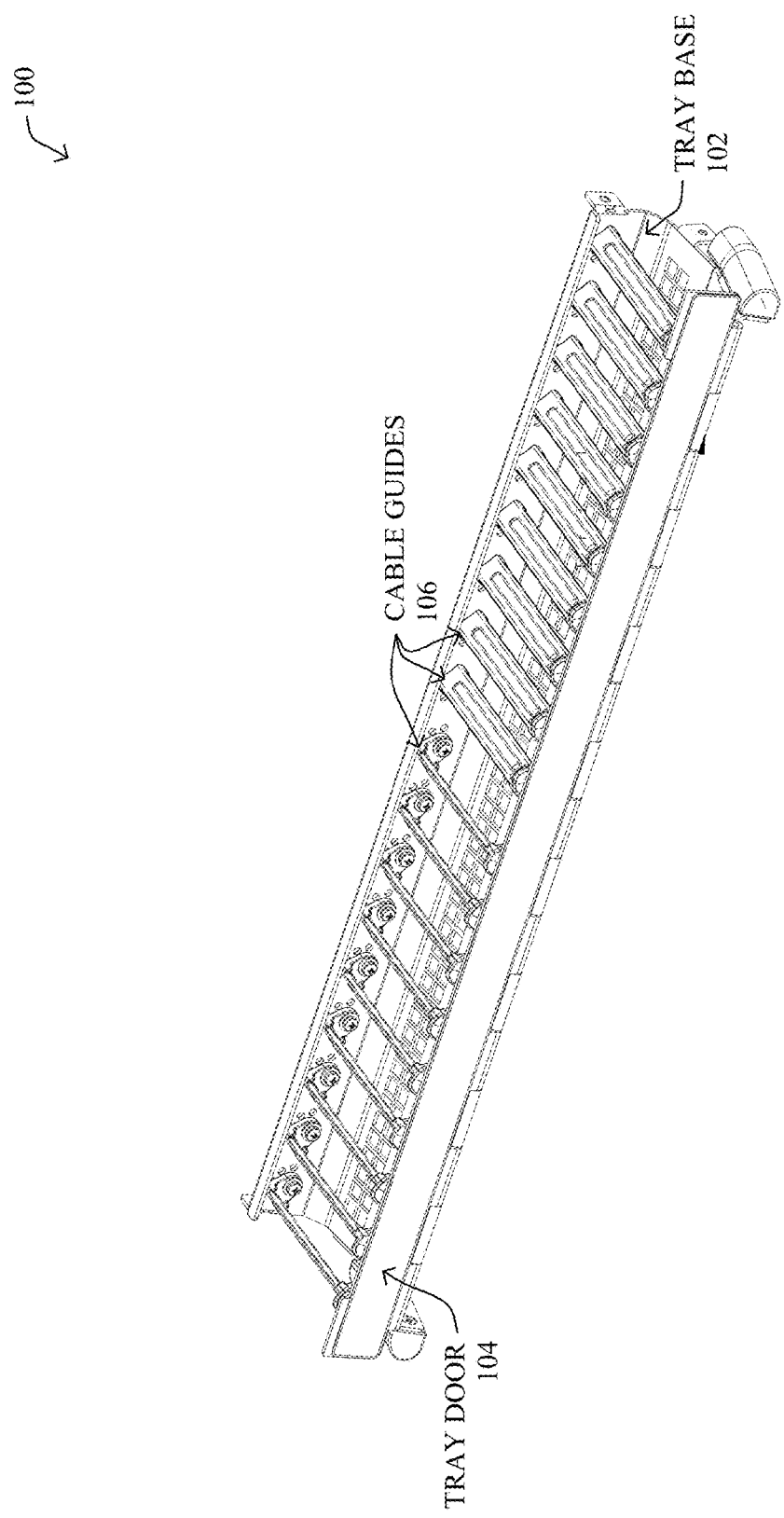
FIGS. 1A-1B illustrate an example cable management system.
Figure 1B:
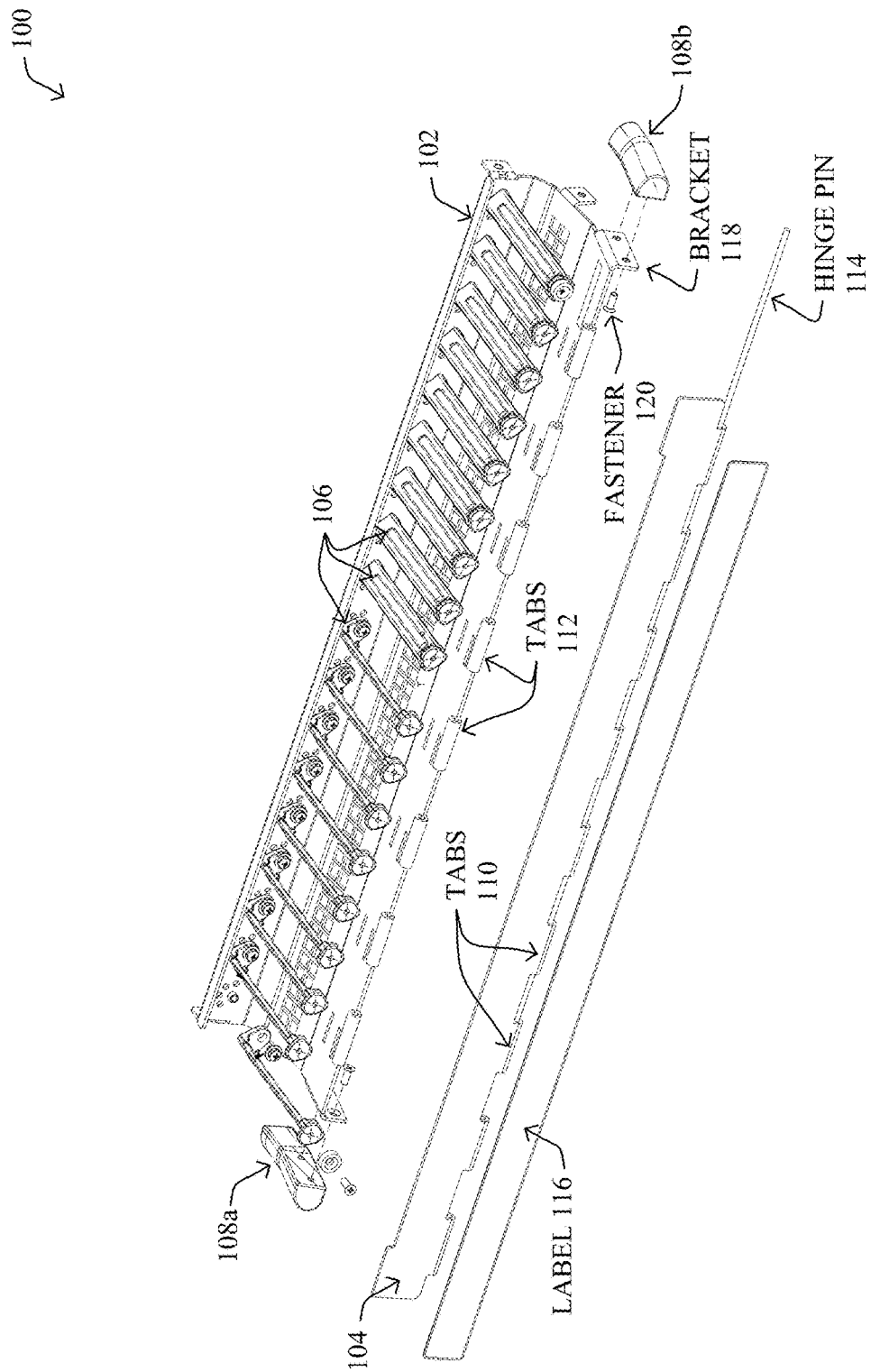

FIGS. 1A-1B illustrate an example cable management system 100, according to various embodiments. Generally, cable management system 100 may be attached to a line card chassis, thereby routing cables extending from the line cards either to the left or to the right of system 100. Typically, such as in core and transport applications, cable management is bifurcated whereby half of the cabling from the cards is routed to the left and the other half routed to the right, based on the location of the cards. However, other applications such as switching, enterprise, and access often require the cabling to exit in different directions, depending on the installation guidelines.

As shown in FIG. 1A, system 100 generally includes a tray base 102 that is coupled to the rack chassis. Tray base 102 may comprise a single piece (e.g., fabricated from a single sheet of metal, etc.) or may be formed by coupling several components together (e.g., the various sides of tray base 102, etc.).

Located within tray base 102 are any number of cable guides 106 oriented such that their associated cabling is routed towards one of the two open ends of tray base 102. For example, the orientations of cable guides 106 in FIG. 1A illustrate a bifurcated configuration, thereby routing the left-hand cables to the left egress of cable management system 100 and the right-hand cables to the right egress of cable management system 100 within the tray.

Cable management system 100 may also include a tray door 104 that provides access to the cables and cable guides 106 within system 100. Notably, when folded down, tray door 104 allows a user/technician to access the cables and cable guides 106 while concealing and protecting them when tray door 104 is in its closed position.

FIG. 1B illustrates an exploded view of cable management system 100, according to various embodiments. As shown, tray door 104 may be hinged to tray base 102, to allow tray door 104 to rotatably move between open and closed positions. For example, tray door 104 may include any number of tabs 110 that align with alternately located tabs 112 of tray base 102. Both sets of tabs 110-112 may be hollow, allowing a hinge pin 114 to be inserted through tabs 110-112, thereby forming a hinge between tray door 104 and tray base 102. Other hinge mechanisms may be used in further embodiments. Thus, during use, tray door 104 may rotate about the hinge between a closed/up position and an open/down position that exposes cable guides 106 and their corresponding cables to a technician in front of cable management system 100. Tray base 102 may also include side brackets 118 to which side members 108a-108b are affixed using fasteners 120.

In some cases, tray door 104 may be configured to be substantially flush with the exterior housing of the rack chassis when in its closed position. Advantageously, this allows a technician to place labels onto the exterior of tray door 104, such as to identify the cables and/or cards associated within system 100. For example, a label 116 may be affixed to tray door 104 (e.g., using an adhesive, removable means, etc.), to allow the technician to label the cards and/or cables that are managed by system 100.

Figure 2A:
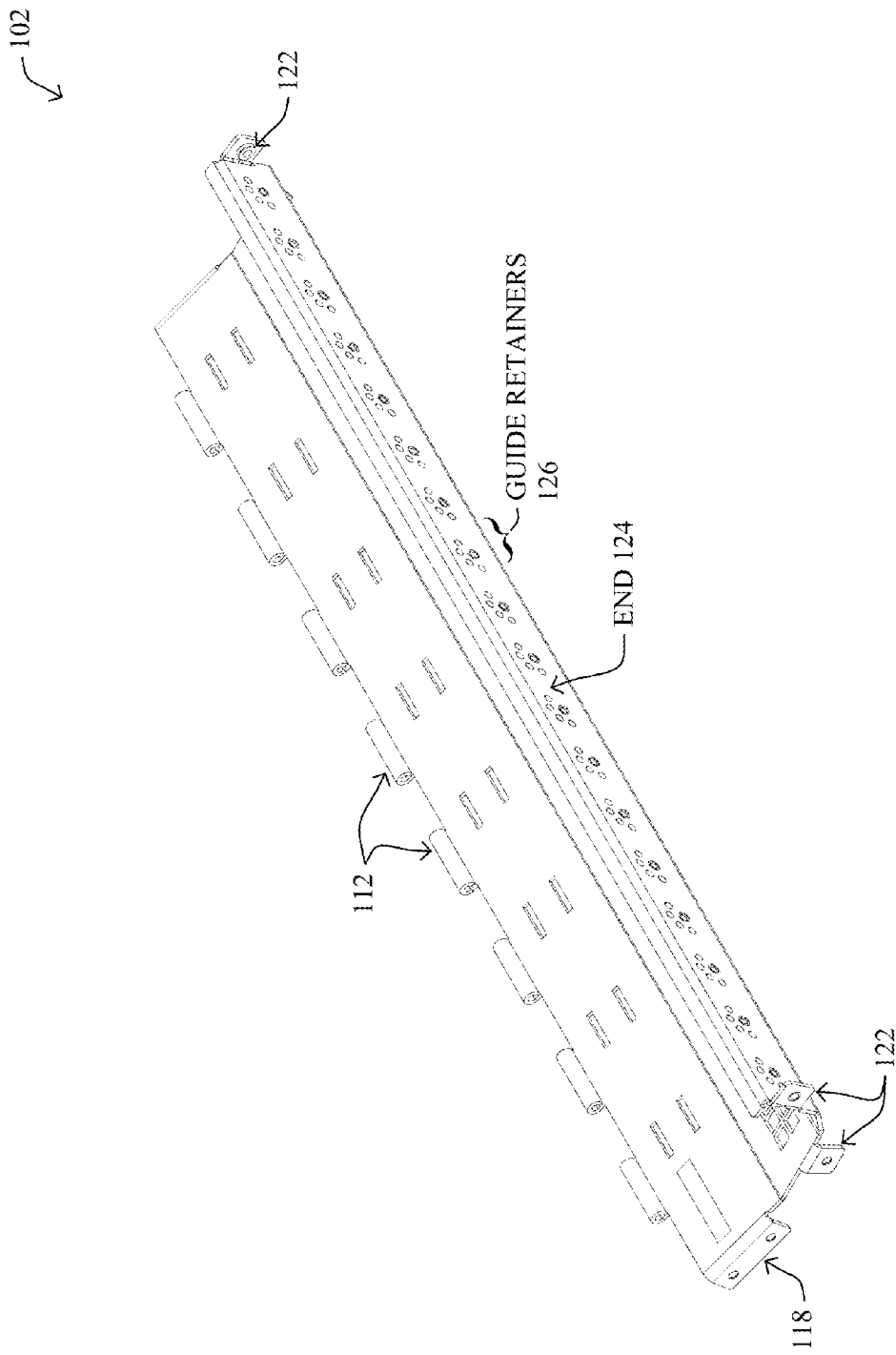
FIGS. 2A-2C illustrate an example tray base for a cable management system.

FIG. 2A illustrates a back perspective view of tray base 102, according to various embodiments. As shown, tray base 102 may further include any number of brackets 122 to couple tray base 102 to a chassis of a card rack.

According to various embodiments, to couple and retain cable guides 106 to end 124 of tray base 102, tray base 102 may include any number of corresponding guide retainers 126. In some cases, guide retainers 126 may include apertures through which a fastener, prong, etc. of a cable guide 106 may extend, thereby coupling a given cable guide 106 to end 124 within system 100.

Figure 2B:
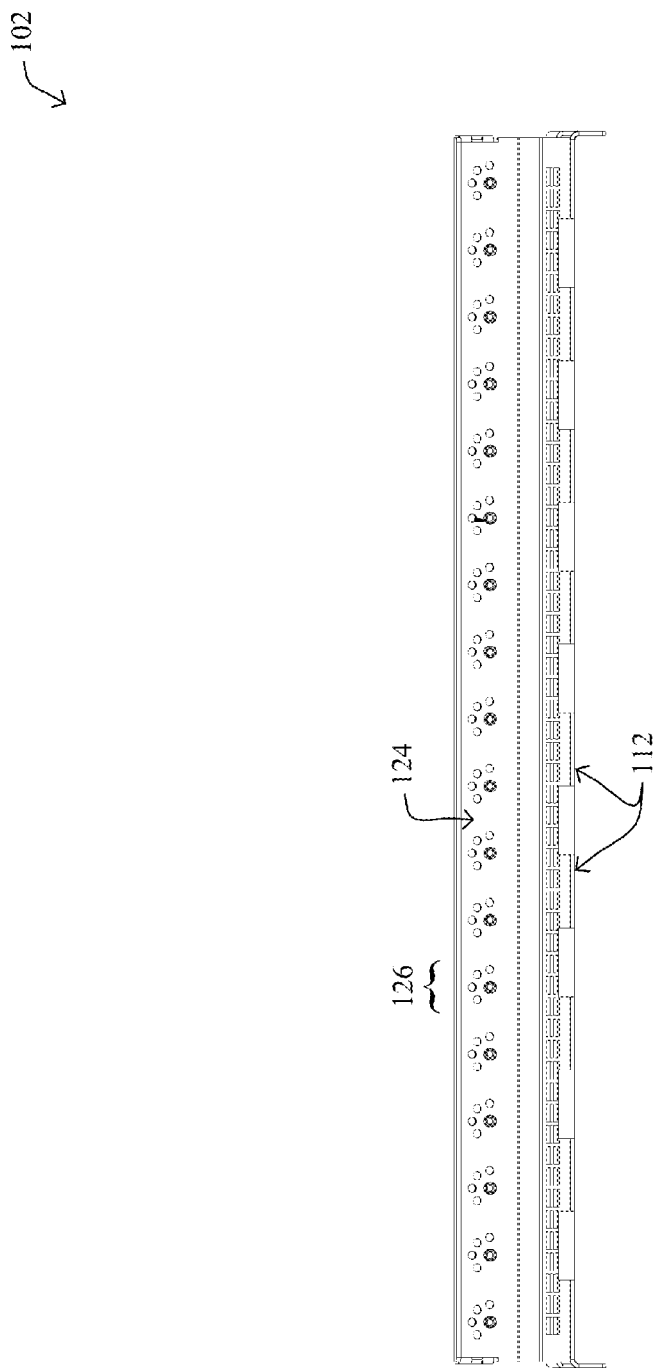

FIG. 2B illustrates the opposing view of end 124 of tray base 102 and guide retainers 126, without tray door 104 attached to tray base 102. As shown, cable guides 106 may each have a corresponding set of guide retainers 126 configured to couple a particular cable guide 106 to tray base 102 (e.g., by inserting one or more prongs of a cable guide 106 into the corresponding apertures of guide retainers 126.

Figure 2C:
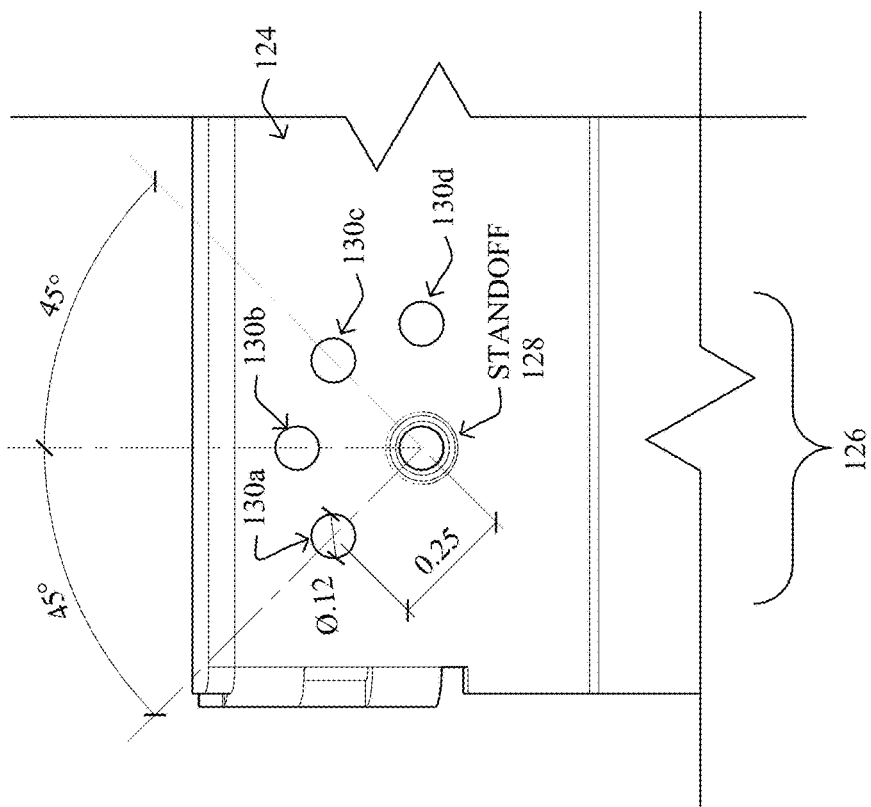

Referring now to FIG. 2C, a close-up view of a set of guide retainers 126 for a cable guide 106 is shown from the same perspective as that of FIG. 2B. As shown, guide retainers 126 may include a central standoff 128 surrounded by any number of apertures 130 in end 124 of tray base 102 that are offset from standoff 128 at a suitable distance. For example, as shown, each of apertures 130a-130d may be equally spaced from standoff 128.

According to various embodiments, apertures 130a-130d may be located on end 124 of tray base 102 at any number of desired angles relative to standoff 128. For example, each of apertures 130a-130d may be separated by 45° or thereabouts. When a cable guide 106 is installed, the user may orient cable guide 106 such that one or more engagement prongs on the end of cable guide 106 engage a selected set of apertures 130a-130d. Thus, the user may be able to select the orientation/angle of cable guide 106 when installing cable guide 106, to route the cable(s) in a desired direction towards an egress of the cable tray.

Figure 3A:
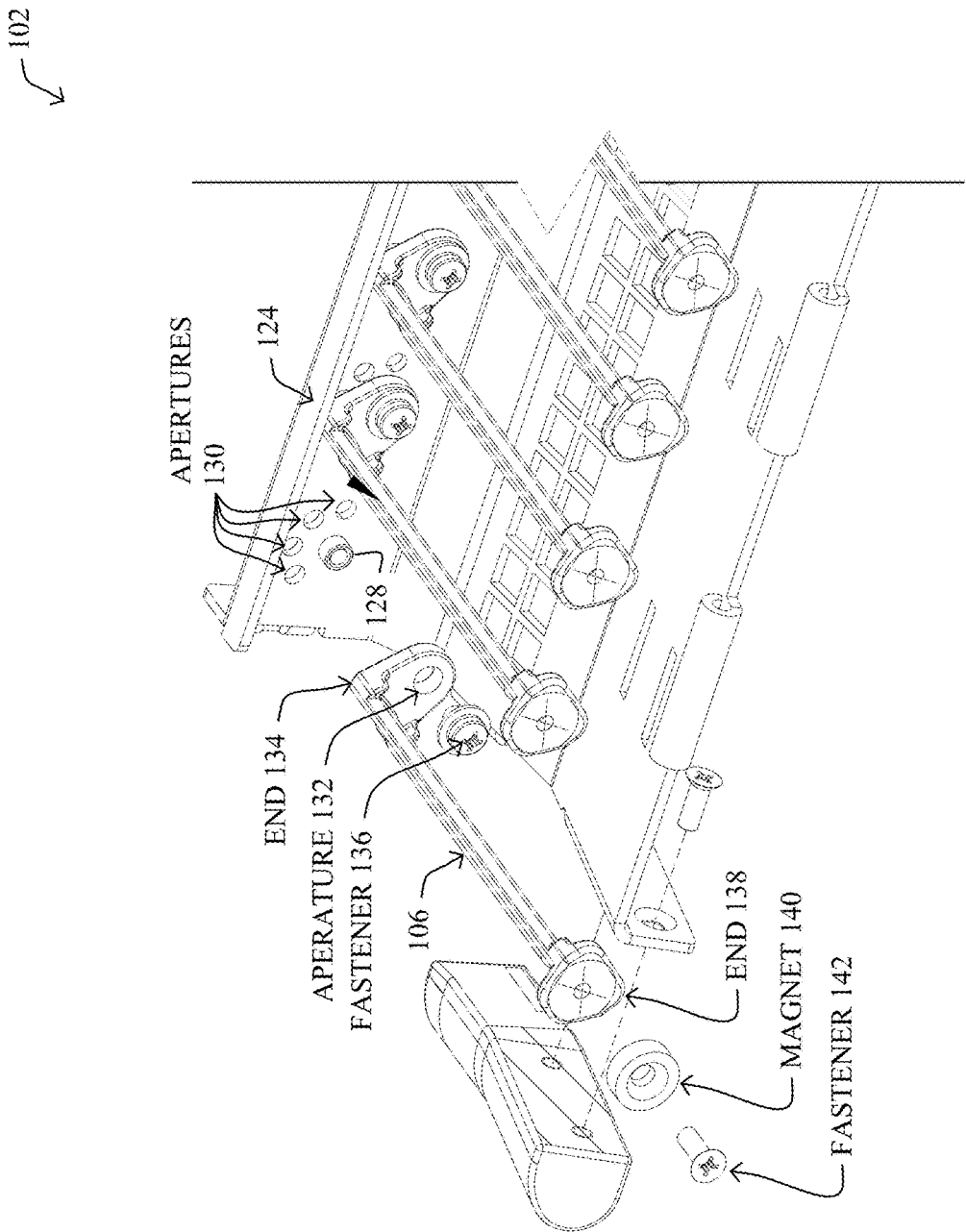
FIGS. 3A-3B illustrate examples of cable guides selectively coupled to a tray base.

FIG. 3A illustrates the assembly and installation of a cable guide 106 into tray base 102, according to various embodiments. As shown, cable guide 106 may include an end 134 configured to couple with end 124 of tray base 102. For example, end 134 of cable guide 106 may include an aperture 132 that engages standoff 128 during installation of cable guide 106. In turn, the user may install a fastener 136 through aperture 132 of cable guide 106 and into standoff 128, to retain cable guide 106 into position. In addition, end 134 of cable guide 106 may include any number of engagement prongs (not shown) that engage a selected set of apertures 130, thereby orienting cable guide 106 at the desired angle.

In some embodiments, end 138 distal to end 134 of cable guide 106 may be configured to engage and/or retain tray door 106 when tray door 106 is in its closed position. For example, a magnet 140 may be fastened to end 138 of cable guide 106 via a fastener 142. Thus, when in contact with tray door 106, magnet 140 may provide an attractive force to tray door 106, thereby keeping tray door 106 closed. Magnet 140 may be affixed to cable guide 106 in any number of ways, in further embodiments (e.g., as an overmolded magnet, via an adhesive, or the like). In other embodiments, cable guide 106 may include other means to retain tray door 106 such as hook and loop fasteners, a latch and key mechanism, or the like.

Figure 3B:
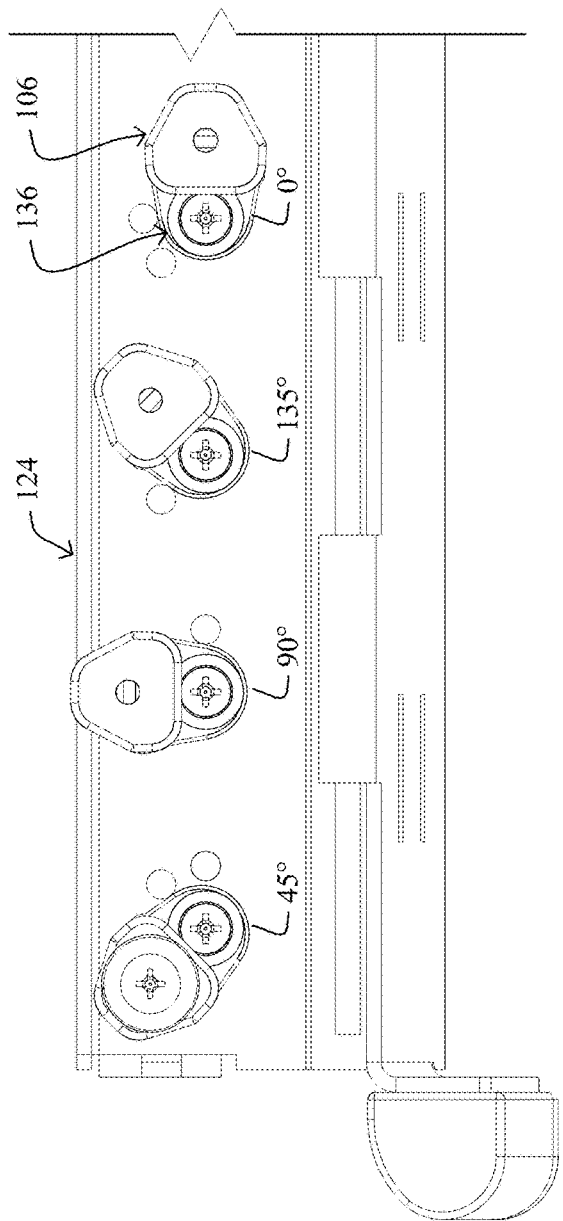

FIG. 3B illustrates the various angles/orientations that may be selected when coupling a cable guide 106 to end 124 of tray base 102. Notably, fastener 136 may engage standoff 128 to couple cable guide 106 to end 124 and the engagement of the prong(s) of cable guide 106 to the selected set of aperture(s) 130 may dictate the installation angle of cable guide 106. For example, assume that cable guide 106 includes a single prong to engage one of apertures 130a-130d shown previously in FIG. 2C. In such a case, each of the selectable apertures 130a-130d may change the installation angle of cable guide 106 by approximately 45°. In particular, apertures 130 in end 124 of tray base 102 may be configured to allow placement of the cable guide 106 in one of four positions, corresponding to 0°, 135°, 90°, and 45°, accordingly. In other embodiments, end 124 of tray base 102 may include any number of apertures 130 located to allow cable guide 106 to be installed at any number of different selectable angles, as desired.

Figure 4A:
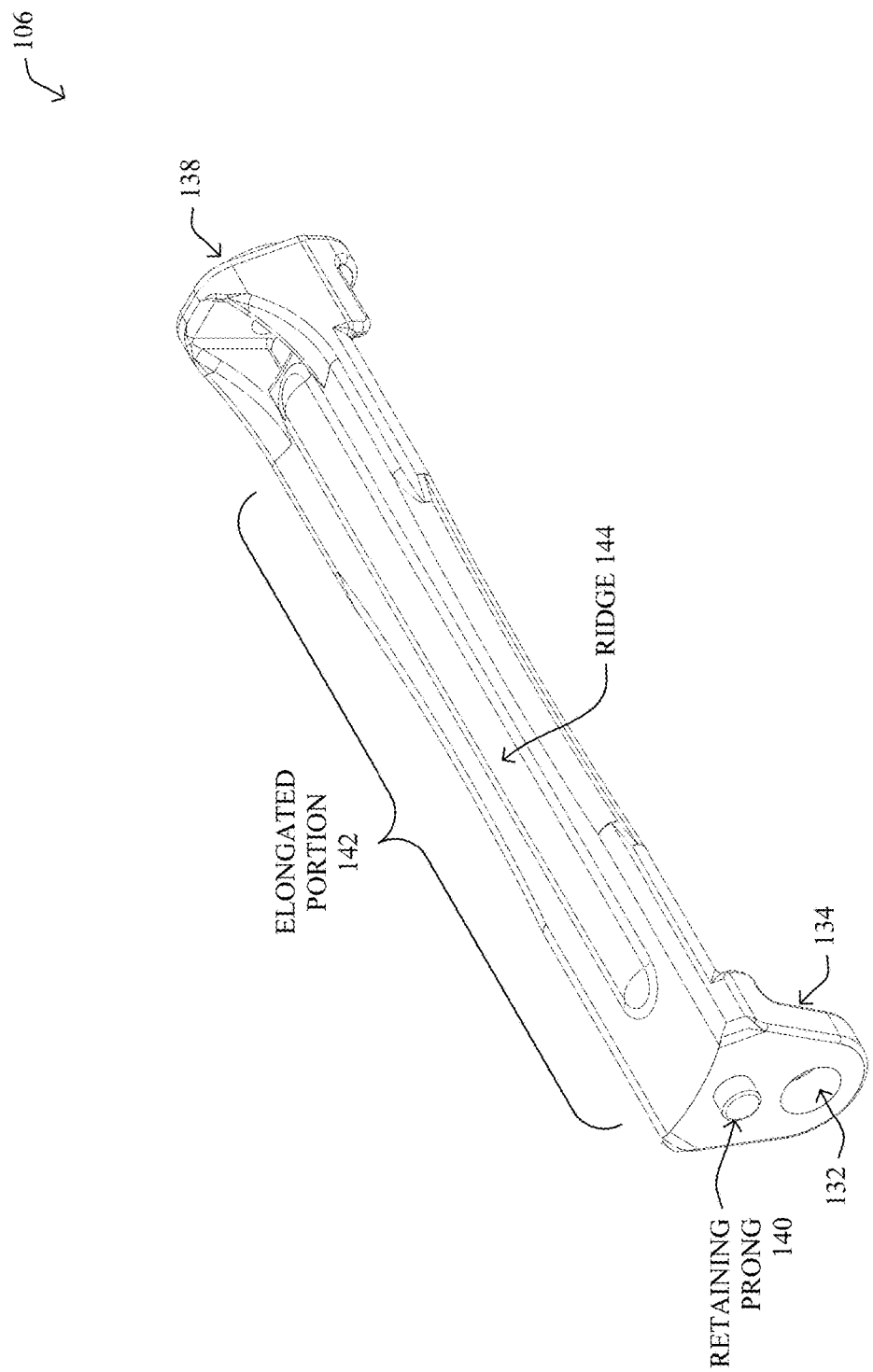

FIGS. 4A-4C illustrate an example cable guide 106, according to various embodiments. FIG. 4A illustrates an example perspective view of cable guide 106 to show end 134 that engages end 124 of tray base 102 in greater detail. As shown, end 134 may include an aperture 132 which may, in some embodiments, engage standoff 128 of tray base 102. Fastener 136 (e.g., a screw, bolt, etc.) inserted through aperture 134 into standoff 128 may then provide compressive force to cable guide 106 to couple end 134 of cable guide 106 to tray base 102. As would be appreciated, other fastening mechanisms may be used in other embodiments.

As noted previously, end 134 of cable guide 106 may include retaining prong 140 configured to engage a selected one of apertures 130 of tray base 102. Thus, while cable guide 106 may always engage standoff 128 at a fixed location through aperture 132, the selection of aperture 130 engaged by retaining prong 140 will cause cable guide 106 to rotate about the axis that extends through aperture 132 thereby allowing the technician to select the installation angle for cable guide 106.

Cable guide 106 may also include a generally flat, elongated portion 142 that connects end 134 to end 138 which may engage tray door 106 in some embodiments. As shown, some embodiments provide for elongated portion 142 to include a ridge 144 that may provide additional support strength to cable guide 106 and may be rounded such that there are no sharp edged on which a cable may get caught. Such rounded features may be included elsewhere in cable guide 106 for similar reasons.

In the side view of cable guide 106 shown in FIG. 4B, some embodiments provide for cable guide 106 to include a curvature 146 that connects elongated portion 142 to end 138. Generally, elongated portion 142, curvature 146 (if present), and end 138 may be sized such that cable guide 106 provides enough clearance for the ejector of the corresponding line card to be actuated by the technician. FIG. 4C illustrates a further top view of cable guide 106.

FIGS. 5A-5B illustrate example retention ends of a cable guide 106, according to various embodiments. As noted, end 134 may include any number of retention prongs 140 that extend from end 134 of cable guide 106 to engage a selected set of apertures 130 of tray base 102. For example, FIG. 5A illustrates an embodiment in which cable guide 106 includes a single retention prong 140 that engages a single selected aperture 130 of tray base 102 to orient cable guide 106 at the selected angle. In another embodiment, as shown in FIG. 5B, cable guide 106 may instead include two retention prongs 140a-140b that engage a selected set of two apertures 130 of tray base 102. Other embodiments provide for a greater number of retention prongs 140 as desired.

FIGS. 6A-6B illustrate example door engagement ends of a cable guide 106, according to various embodiments. As shown in FIG. 6A, cable guide 106 may include a curvature 146 between elongated portion 142 and end 138 that engages tray door 104, in some embodiments. Curvature 146 may provide additional support to end 138 while also have the additional functionality of directing a cable towards the middle of elongated portion 142. In particular, if a cable is accidentally positioned near tray door 104, gravitational forces may cause the cable to slide down curvature 146 towards the middle of elongated portion 142 so that the cable does not get pinched during operation (e.g., when the ejector of the line card is actuated).

FIG. 6B illustrates an alternative configuration for end 138 that does not include curvature 146. Instead, cable guide 106 may include a portion 146a that provides for a substantially perpendicular joint between end 138 and elongated portion 142. However, as noted, if a cable is located in the region of portion 146a, this may lead to pinching of the cable, in some cases.

Figure 7:
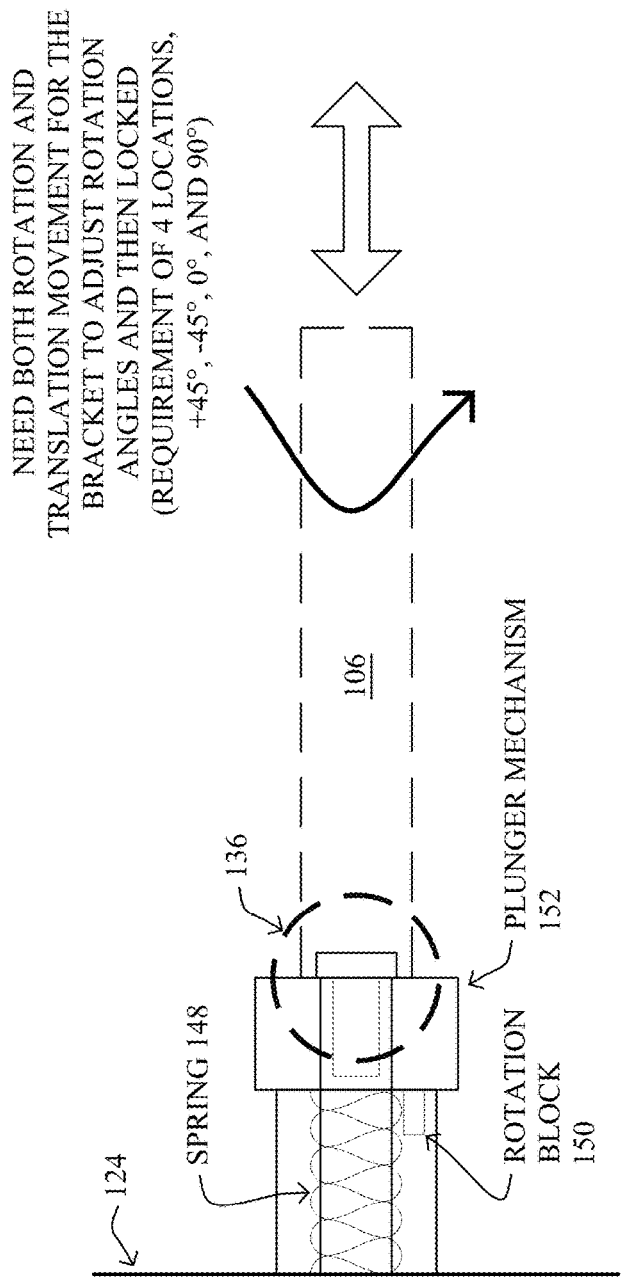
FIG. 7 illustrates an example plunger mechanism for a cable guide.

FIG. 7 illustrates an example plunger mechanism for a cable guide, according to various embodiments. In some embodiments, end 134 of cable guide 106 may be coupled to a plunger mechanism 152 via fastener 136. Generally, plunger mechanism 152 may be flush with end 124 of tray base 102 such that no part extends externally outward from tray base 102. To adjust the angle of cable guide 106, plunger mechanism 152 may include a spring 148 and an internal rotation lock 150 configured to allow cable guide 106 to be positioned at any number of selectable angles. During use, application of rotational and translational forces on cable guide 106 may allow the technician to engage rotation lock 150 at any number of positions, such as at 45°, −45°, 0°, 90°, or any other selectable angle.

Figure 8:
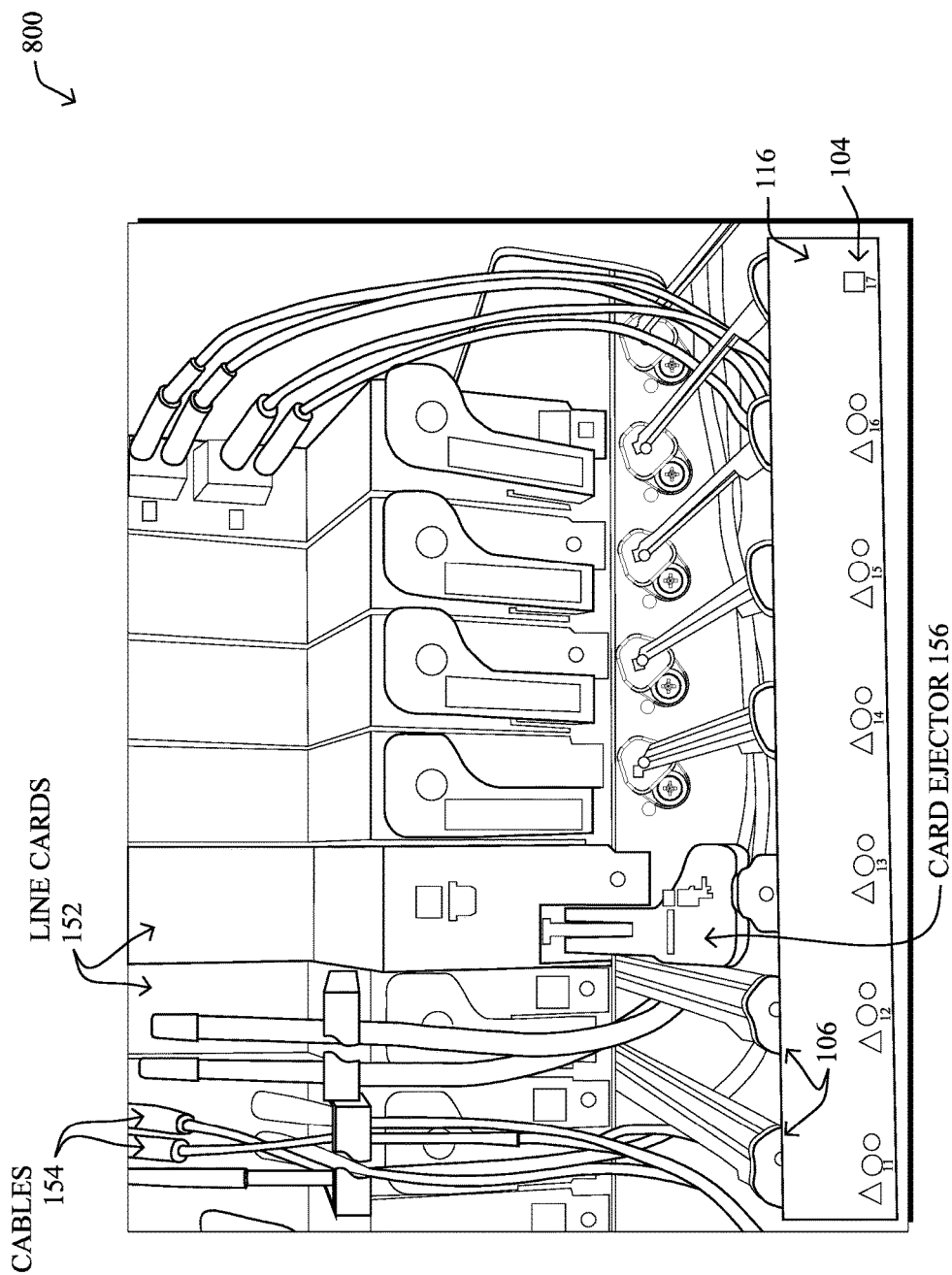
FIG. 8 illustrates an example cable management system routing cables in a rack.

FIG. 8 illustrates an example cable management system routing cables, according to various embodiments. As shown in illustration 800, tray base 102 may be coupled to the housing of a line card rack such that insertable line cards 152 have corresponding cable guides 106 configured to route cables 154. In particular, any given card 152 may have one or more cables 154 that extends outward from the card and is routed by the corresponding cable guide 106 for the card towards a desired egress (e.g., to the left or right of the rack) based on the angle of the cable guide 106. Tray door 104 may allow a technician access to line cards 152, cables 154, and cable guides 106. Thus, by configuring the angles of cable guides 106 within the cable management system, the technician can route any given cable 154 towards the desired egress point.

Also as shown, cable guides 106 may be configured to provide enough clearance to line cards 152 such that a card ejector 156 can be actuated (e.g., to install or remove a given card 152).

The techniques described herein, therefore, provide an adjustable cable management system that allows users to select one of a plurality of positions for a cable guide, on a per slot basis. The adjustable cable guides also offer a direction that can minimize consumed volume when that slot is not in use. Since multiple rows of round pegs are not required for the system, 15% or more of the volume for the peg system is available for cabling.

While there have been shown and described illustrative embodiments that provide for a cable management system, it is to be understood that various other adaptations and modifications may be made within the spirit and scope of the embodiments herein. For example, while certain embodiments are described herein with respect to using certain guide positions, these configurations are illustrative only and any number of different configurations may be used.

The foregoing description has been directed to specific embodiments. It will be apparent, however, that other variations and modifications may be made to the described embodiments, with the attainment of some or all of their advantages. Accordingly this description is to be taken only by way of example and not to otherwise limit the scope of the embodiments herein. Therefore, it is the object of the appended claims to cover all such variations and modifications as come within the true spirit and scope of the embodiments herein.

What is claimed is:

1. An adjustable cable management system comprising:
a tray base having a first end;
a tray door coupled to the tray base and substantially parallel and opposite the first end of the tray base when in a closed position;
a plurality of apertures formed only in the first end the tray base around a central standoff at a plurality of selectable circumferential locations from the central standoff; and
a plurality of cable guides coupled to the first end of the tray base and located between the first end of the tray base and the tray door, wherein a proximal end of a particular cable guide of the plurality of cable guides is coupled to the central standoff and at a selected circumferential location from among the plurality of selectable circumferential locations through at least one aperture of the plurality of apertures,
wherein the particular cable guide includes an elongated portion and is configured to engage the tray door with a distal end opposite the proximal end.

2. The cable management system as in claim 1, wherein the tray door is rotatably coupled to the tray base to allow a user access to the plurality of cable guides.

3. The cable management system as in claim 1, wherein each location of the plurality of selectable circumferential locations is approximately 45 degrees apart from a respective adjacent circumferential location.

4. The cable management system as in claim 1, wherein the particular cable guide further comprises a single prong that engages a selected one of the apertures that corresponds to the selected circumferential location.

5. The cable management system as in claim 1, wherein the particular cable guide further comprises a plurality of prongs that engage a selected subset of the apertures that correspond to the selected circumferential location.

6. The cable management system as in claim 1, wherein one or more of the cable guides further comprise a magnet to releasably couple the tray door to the one or more cable guides.

7. The cable management system as in claim 1, wherein the distal end of the particular cable guide proximate to the tray door is shaped to allow sufficient clearance for a card ejector.

8. The cable management system as in claim 1, further comprising: a screw that couples the proximal end of the particular cable guide to the first end of the tray base.

9. The cable management system as in claim 1, further comprising: a spring loaded plunger that couples the proximal end of the particular cable guide to the first end of the tray base, wherein the spring loaded plunger comprises a rotation lock configured to orient the particular cable guide at the selected circumferential location.

10. The cable management system as in claim 1, wherein the tray door further comprises a label.

11. The cable management system as in claim 1, wherein the particular cable guide further comprises: a curved portion extending from the elongated portion to the proximal end engaged with the tray door, wherein the curved portion is configured to direct a cable into contact with the elongated portion.

* * * * *